United States Patent
Chao

(10) Patent No.: US 11,940,486 B2
(45) Date of Patent: Mar. 26, 2024

(54) PROBE STATION CAPABLE OF MAINTAINING STABLE AND ACCURATE CONTACT TO DEVICE UNDER TEST

(71) Applicant: NANYA TECHNOLOGY CORPORATION, New Taipei (TW)

(72) Inventor: Yi-Kai Chao, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/805,027

(22) Filed: Jun. 1, 2022

(65) Prior Publication Data

US 2023/0393191 A1    Dec. 7, 2023

(51) Int. Cl.
*G01R 31/28* (2006.01)

(52) U.S. Cl.
CPC ..... *G01R 31/2889* (2013.01); *G01R 31/2865* (2013.01); *G01R 31/2868* (2013.01)

(58) Field of Classification Search
CPC ........... G01R 31/2887; G01R 1/07342; G01R 1/0408; G01R 1/07364; G01R 1/06711; G01R 1/073; G01R 31/2891; G01R 1/04; G01R 1/06705; G01R 31/2893; G01R 31/2865; G01R 1/067; G01R 1/06794; G01R 31/2806; G01R 31/2808; G01R 31/2851; G01R 31/2896
See application file for complete search history.

(56) References Cited

U.S. PATENT DOCUMENTS

| | | | | |
|---|---|---|---|---|
| 4,266,191 A | * | 5/1981 | Spano | G01R 31/2887 324/754.03 |
| 5,731,708 A | * | 3/1998 | Sobhani | G01R 31/2887 324/750.22 |
| 6,037,793 A | * | 3/2000 | Miyazawa | G01R 31/2831 324/762.05 |
| 6,900,649 B1 | * | 5/2005 | Knauer | G01R 31/2889 324/754.07 |
| 7,119,566 B2 | * | 10/2006 | Kim | G01R 31/2887 324/750.19 |
| 7,180,317 B2 | * | 2/2007 | Hollman | G01R 31/2851 324/750.08 |
| 7,323,861 B2 | * | 1/2008 | Bucksch | G01R 31/2889 324/750.02 |
| 10,955,451 B2 | * | 3/2021 | Wang | G01R 1/045 |

FOREIGN PATENT DOCUMENTS

| | | | |
|---|---|---|---|
| CN | 203109877 U | * | 8/2013 |
| TW | M574688 U | | 2/2019 |

* cited by examiner

*Primary Examiner* — Vinh P Nguyen
(74) *Attorney, Agent, or Firm* — CKC & Partners Co., LLC

(57) ABSTRACT

A probe station includes a frame, a platform, a testing equipment, a probe holder and at least one probe. The frame defines an accommodation space. The platform is connected with the frame. The platform has an opening. The opening is communicated with the accommodation space. The testing equipment is at least partially disposed in the accommodation space and is at least partially exposed through the opening. The probe holder is disposed on the platform. The probe is held by the probe holder. The probe holder is configured to control the probe to contact with a device under test disposed on the testing equipment through the opening.

17 Claims, 6 Drawing Sheets

PROBE STATION CAPABLE OF MAINTAINING STABLE AND ACCURATE CONTACT TO DEVICE UNDER TEST

BACKGROUND

Technical Field

The present disclosure relates to probe stations. More particularly, the present disclosure relates to probe stations for testing memory cards.

Description of Related Art

As the demand for electronic devices has been increasing nowadays, the quality of various components of electronic devices becomes an important issue of the industry. Apart from improving the technology of manufacture of the components, the accuracy of testing for the components has also become more important.

For example, probe stations are in general used to test the electrical behavior of electronic components in the industry. Hence, the standard of testing accuracy of probe stations is undoubtedly an important issue which the industry highly concerns.

SUMMARY

A technical aspect of the present disclosure is to provide a probe station, which can maintain the contact of a device under test by a probe stable and accurate during the operation of a testing equipment.

According to an embodiment of the present disclosure, a probe station includes a frame, a platform, a testing equipment, a probe holder and at least one probe. The frame defines an accommodation space. The platform is connected with the frame. The platform has an opening. The opening is communicated with the accommodation space. The testing equipment is at least partially disposed in the accommodation space and is at least partially exposed through the opening. The probe holder is disposed on the platform. The probe is held by the probe holder. The probe holder is configured to control the probe to contact with a device under test disposed on the testing equipment through the opening.

In one or more embodiments of the present disclosure, the testing equipment is configured to transmit a high frequency signal to the device under test and receive a feedback signal from the device under test.

In one or more embodiments of the present disclosure, the testing equipment includes a main body and a load board. The load board is connected with the main body. The load board is exposed through the opening and is configured to support the device under test.

In one or more embodiments of the present disclosure, the probe station further includes a plurality of first buffering pieces. The first buffering pieces are connected between the platform and the main body. The first buffering pieces are separated from each other.

In one or more embodiments of the present disclosure, at least one of the first buffering pieces is elastic.

In one or more embodiments of the present disclosure, at least one of the first buffering pieces is a spring.

In one or more embodiments of the present disclosure, the probe station further includes a plurality of second buffering pieces. The second buffering pieces are connected between the frame and the main body. The second buffering pieces are separated from each other.

In one or more embodiments of the present disclosure, at least one of the second buffering pieces is elastic.

In one or more embodiments of the present disclosure, at least one of the second buffering pieces is a spring.

In one or more embodiments of the present disclosure, the probe station further includes a plurality of rollers. The rollers are connected to a side of the frame away from the platform.

In one or more embodiments of the present disclosure, the probe station further includes a microscope. The microscope is slidably connected with the platform and is configured to obtain an image of the device under test.

In one or more embodiments of the present disclosure, the probe station further includes a display device. The display device is connected with the frame and is signally connected with the microscope.

In one or more embodiments of the present disclosure, the opening is square in shape.

According to an embodiment of the present disclosure, a probe station includes a trolley, a high-speed memory tester, a probe holder and at least one probe. The trolley includes a platform, a plurality of rollers and a frame. The platform has an opening. The frame is connected between the platform and the rollers. The frame has an accommodation space. The accommodation space is communicated with the opening. The high-speed memory tester is at least partially disposed in the accommodation space and is at least partially exposed through the opening. The probe holder is disposed on the platform. The probe is held by the probe holder. The probe holder is configured to control a tip of the probe to contact with a memory card disposed on the high-speed memory tester through the opening and signally connected with the high-speed memory tester.

In one or more embodiments of the present disclosure, the high-speed memory tester includes a main body and a load board. The load board is connected with the main body. The load board is exposed through the opening and is configured to support the memory card.

In one or more embodiments of the present disclosure, the probe station further includes a plurality of first buffering pieces and a plurality of second buffering pieces. The first buffering pieces are connected between the platform and the main body. The first buffering pieces are separated from each other. The second buffering pieces are connected between the frame and the main body. The second buffering pieces are separated from each other.

In one or more embodiments of the present disclosure, each of the first buffering pieces and each of the second buffering pieces are respectively elastic.

In one or more embodiments of the present disclosure, each of the first buffering pieces and each of the second buffering pieces are respectively a spring.

In one or more embodiments of the present disclosure, the probe station further includes a microscope. The microscope is slidably connected with the platform and is configured to obtain an image of the memory card.

In one or more embodiments of the present disclosure, the probe station further includes a display device. The display device is connected with the frame and is signally connected with the microscope.

The above-mentioned embodiments of the present disclosure have at least the following advantages:

(1) When high-speed memory tester operates, both the first buffering pieces and the second buffering pieces can act as a buffer to absorb vibration. Therefore, vibration from the high-speed memory tester during operation is not transmitted to the platform, and thus the probe holder disposed on the platform is free from vibration during the operation of the high-speed memory tester. In this way, the contact of the memory card by the tip of the probe can maintain stable and accurate during the operation of the high-speed memory tester.

(2) Since the trolley further includes a plurality of rollers configured to roll over a floor, a user can move the probe station between different working locations in an effective and easy manner.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
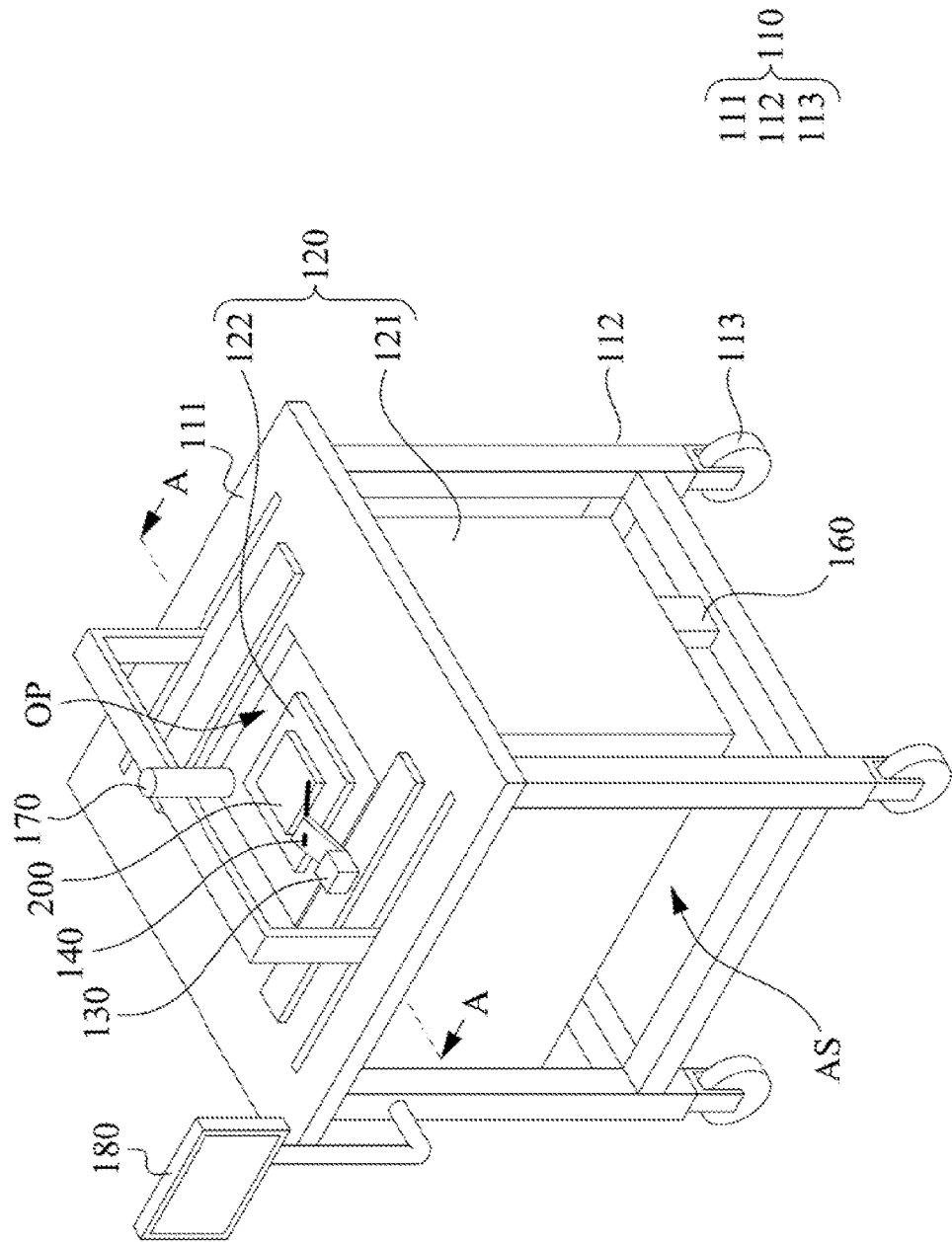
FIG. 1 is a schematic view of a probe station according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
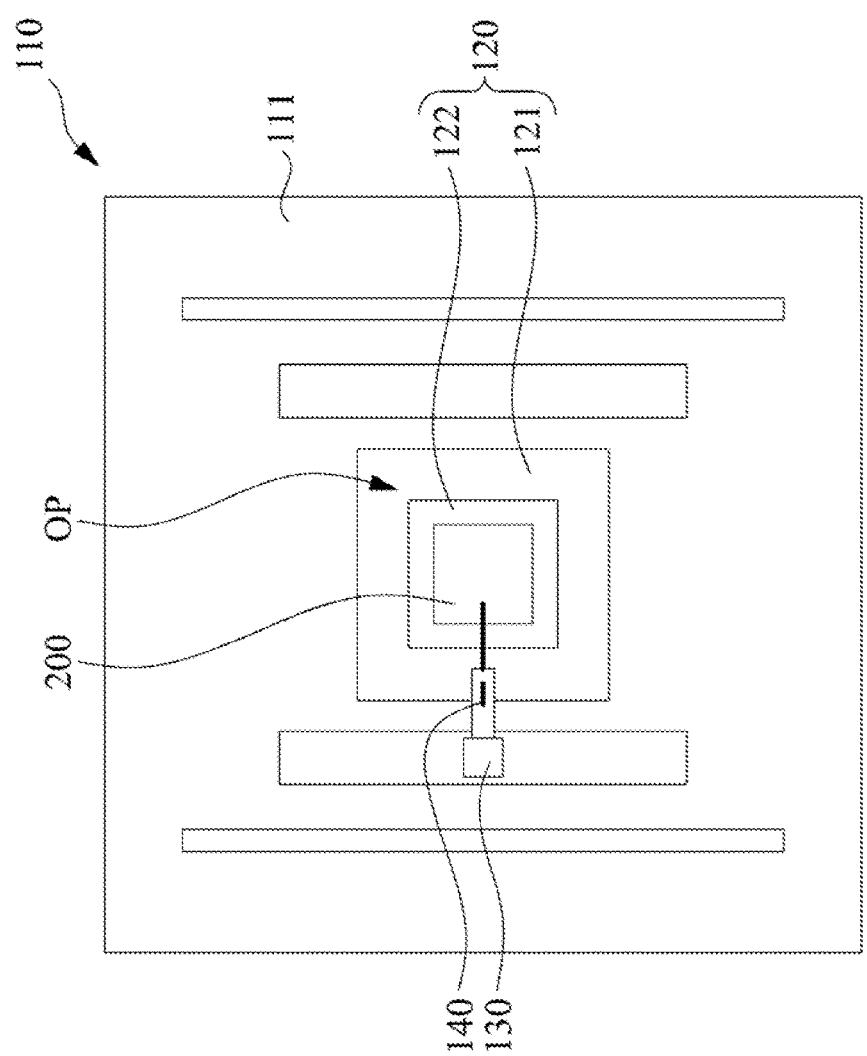
FIG. 2 is a top view of the probe station of FIG. 1, in which the microscope and the display device are omitted for simplification.

Reference is made to FIGS. 1-2. FIG. 1 is a schematic view of a probe station 100 according to an embodiment of the present disclosure. FIG. 2 is a top view of the probe station 100 of FIG. 1, in which the microscope 170 and the display device 180 are omitted for simplification. In this embodiment, as shown in FIGS. 1-2, a probe station 100 includes a trolley 110, a testing equipment 120, a probe holder 130 and at least one probe 140. The trolley 110 includes a platform 111 and a frame 112. The platform 111 is located above the frame 112 and is connected with the frame 112. The frame 112 defines an accommodation space AS. The platform 111 has an opening OP. The opening OP of the platform 111 is communicated with the accommodation space AS defined by the frame 112. The testing equipment 120 is at least partially disposed in the accommodation space AS and is at least partially exposed through the opening OP of the platform 111. The probe holder 130 is disposed on the platform 111. The probe 140 is held by the probe holder 130. The probe holder 130 is configured to control a tip of the probe 140 to contact with a device under test 200. The device under test 200 is disposed on the testing equipment 120 through the opening OP of the platform 111 and is signally connected with the testing equipment 120. In practical applications, the opening OP is square in shape. For example, the size of the opening OP is 500 mm by 500 mm.

Figure 3:
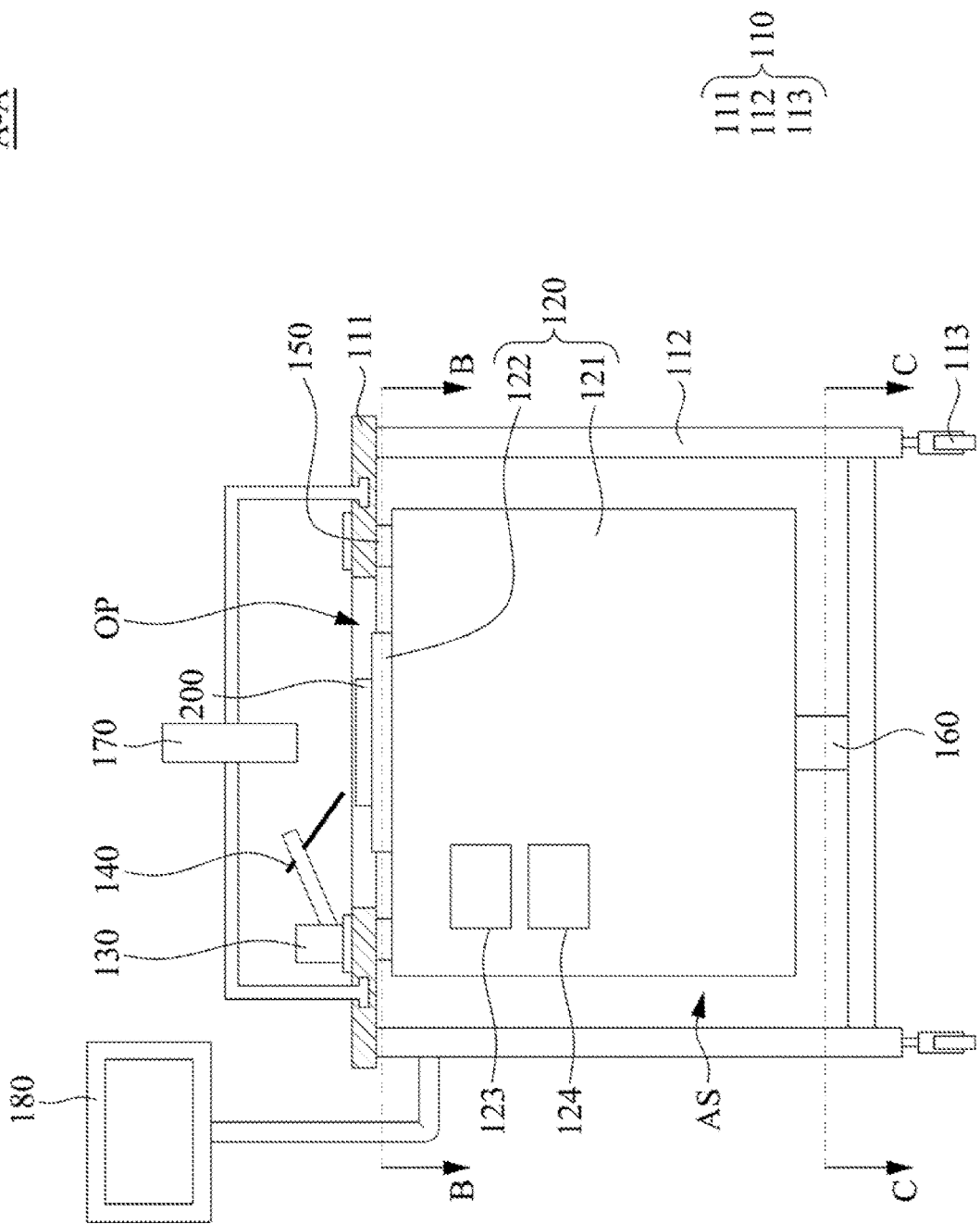
FIG. 3 is a cross-sectional view along the sectional line A-A of FIG. 1.

As shown in FIG. 3, the testing equipment 120 includes a transmitter 123 and a receiver 124. The transmitter 123 and the receiver 124 are disposed on the main body 121. The transmitter 123 is configured to transmit a high frequency signal to the device under test 200. The receiver 124 is configured to receive a feedback signal from the device under test 200. In practical applications, the testing equipment 120 is a high-speed memory tester while the device under test 200 is a memory card, such as a dynamic random-access memory (DRAM). The high-speed memory tester 120 is configured to transmit a high frequency signal to the memory card 200 and receive a feedback signal from the memory card 200.

Furthermore, as shown in FIGS. 1-2, the high-speed memory tester 120 includes a main body 121 and a load board 122. The load board 122 is connected with the main body 121. The load board 122 of the high-speed memory tester 120 is exposed through the opening OP of the platform 111 and is configured to support the memory card 200.

Figure 4:
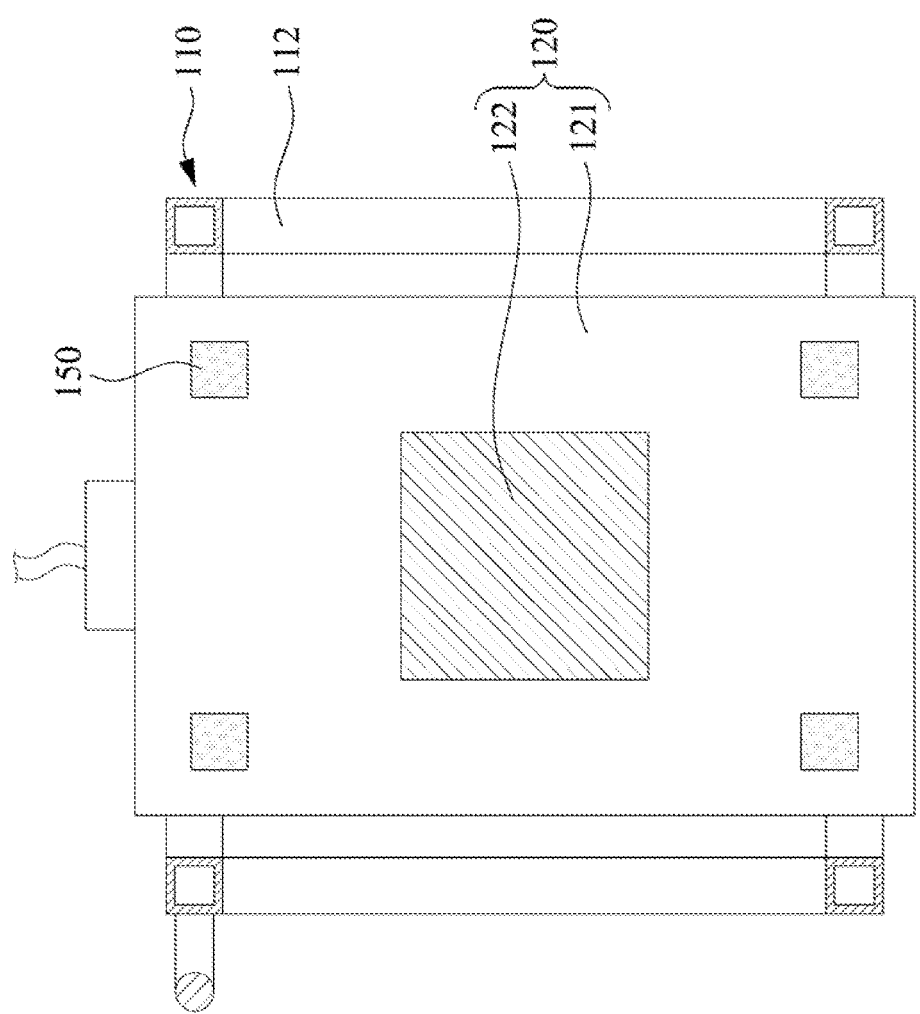
FIG. 4 is a cross-sectional view along the sectional line B-B of FIG. 3.

Reference is made to FIGS. 3-4. FIG. 3 is a cross-sectional view along the sectional line A-A of FIG. 1. FIG. 4 is a cross-sectional view along the sectional line B-B of FIG. 3. In this embodiment, as shown in FIGS. 3-4, the probe station 100 further includes a plurality of first buffering pieces 150. The first buffering pieces 150 are connected between the platform 111 and the main body 121 of the high-speed memory tester 120. Moreover, the first buffering pieces 150 are separated from each other. For example, the quantity of the first buffering pieces 150 as shown in FIG. 4 is four. However, this does not intend to limit the present disclosure. According to the actual situations such as the shape and the weight of the high-speed memory tester 120, the quantity and the pattern of distribution of the first buffering pieces 150 can be adjusted.

When the high-speed memory tester 120 operates, the first buffering pieces 150 can act as a buffer to absorb vibration. Therefore, vibration from the high-speed memory tester 120 during operation is not transmitted to the platform 111, and thus the probe holder 130 disposed on the platform 111 is free from vibration during the operation of the high-speed memory tester 120. In this way, the contact of the memory card 200 by the tip of the probe 140 can maintain stable and accurate during the operation of the high-speed memory tester 120. In some embodiments, at least one of the first buffering pieces 150 is elastic in nature. In other embodiments, each of the first buffering pieces 150 is elastic in nature. However, this does not intend to limit the present disclosure.

Figure 5:
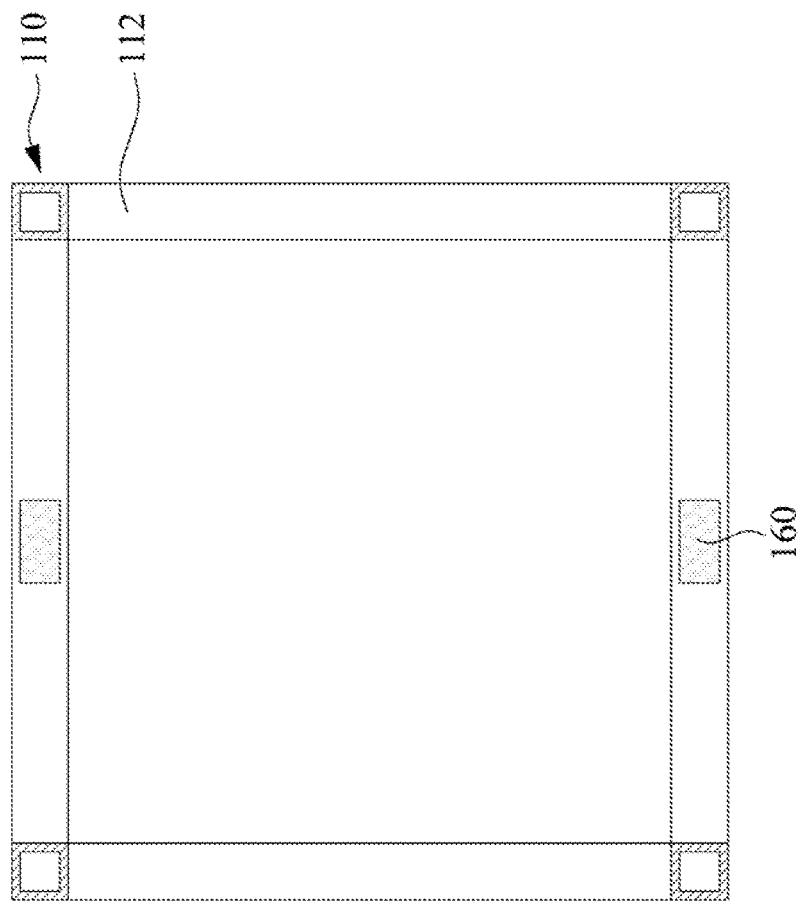
FIG. 5 is a cross-sectional view along the sectional line C-C of FIG. 3.

Reference is made to FIG. 5. FIG. 5 is a cross-sectional view along the sectional line C-C of FIG. 3. In this embodiment, as shown in FIGS. 3 and 5, the probe station 100 further includes a plurality of second buffering pieces 160. The second buffering pieces 160 are connected between the frame 112 and the main body 121 of the high-speed memory tester 120. Moreover, the second buffering pieces 160 are separated from each other. For example, the quantity of the second buffering pieces 160 as shown in FIG. 5 is two. However, this does not intend to limit the present disclosure. According to the actual situations such as the shape and the weight of the high-speed memory tester 120, the quantity and the pattern of distribution of the second buffering pieces 160 can be adjusted.

Similarly, when the high-speed memory tester 120 operates, the second buffering pieces 160 can act as a buffer to absorb vibration. Therefore, vibration from the high-speed memory tester 120 is not transmitted to the platform 111 through the frame 112, and thus the probe holder 130 disposed on the platform 111 is free from vibration during the operation of the high-speed memory tester 120. In this way, the contact of the memory card 200 by the tip of the probe 140 can maintain stable and accurate during the operation of the high-speed memory tester 120. In some embodiments, at least one of the second buffering pieces 160 is elastic in nature. In other embodiments, each of the second buffering pieces 160 is elastic in nature. However, this does not intend to limit the present disclosure.

Furthermore, as shown in FIGS. 1 and 3, the trolley 110 further includes a plurality of rollers 113. The rollers 113 are connected to a side of the frame 112 away from the platform 111. In other words, the frame 112 is connected between the platform 111 and the rollers 113. Each of the rollers 113 of the trolley 110 is configured to roll over a floor. In this way, a user can move the probe station 100 between different working locations in an effective and easy manner.

In addition, as shown in FIGS. 1 and 3, the probe station 100 further includes a microscope 170 and a display device 180. In practice, the microscope 170 is located above the platform 111 and is slidably connected with the platform 111. The microscope 170 is configured to obtain an image of the memory card 200, for example, when the tip of the probe 140 is in contact with the memory card 200. The display device 180 is connected with the frame 112 of the trolley 110 and is signally connected with the microscope 170. In this way, the image obtained by the microscope 170 can be displayed on the display device 180.

Figure 6:
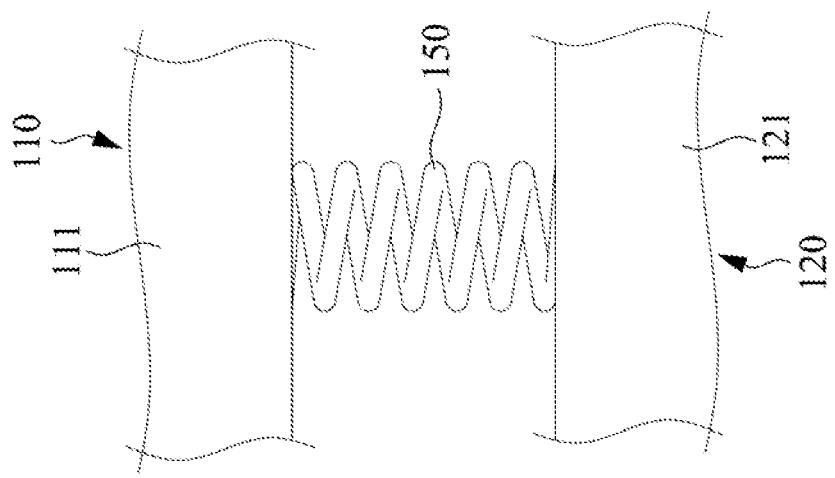
FIG. 6 is a partially enlarged view of a first buffering piece according to another embodiment of the present disclosure.

Reference is made to FIG. 6. FIG. 6 is a partially enlarged view of a first buffering piece 150 according to another embodiment of the present disclosure. In this embodiment, at least one of the first buffering pieces 150 is a spring. As shown in FIG. 6, the first buffering piece 150 is a spring connected between the platform 111 of the trolley 110 and the main body 121 of the high-speed memory tester 120. However, this does not intend to limit the present disclosure.

Figure 7:
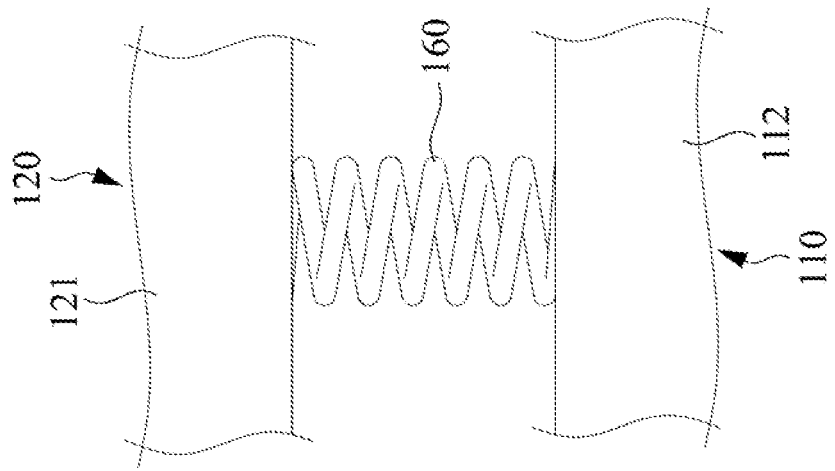
FIG. 7 is a partially enlarged view of a second buffering piece according to another embodiment of the present disclosure.

Reference is made to FIG. 7. FIG. 7 is a partially enlarged view of a second buffering piece 160 according to another embodiment of the present disclosure. In this embodiment, at least one of the second buffering pieces 160 is a spring. As shown in FIG. 7, the second buffering piece 160 is a spring connected between the frame 112 of the trolley 110 and the main body 121 of the high-speed memory tester 120. However, this does not intend to limit the present disclosure.

In conclusion, the aforementioned embodiments of the present disclosure have at least the following advantages:

(1) When the high-speed memory tester operates, both the first buffering pieces and the second buffering pieces can act as a buffer to absorb vibration. Therefore, vibration from the high-speed memory tester during operation is not transmitted to the platform, and thus the probe holder disposed on the platform is free from vibration during the operation of the high-speed memory tester. In this way, the contact of the memory card by the tip of the probe can maintain stable and accurate during the operation of the high-speed memory tester.

(2) Since the trolley further includes a plurality of rollers configured to roll over a floor, a user can move the probe station between different working locations in an effective and easy manner.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A probe station, comprising:
   a frame defining an accommodation space;
   a platform connected with the frame, the platform having an opening communicated with the accommodation space;
   a testing equipment at least partially disposed in the accommodation space, the testing equipment comprising:
      a main body; and
      a load board connected with the main body, the load board being at least partially exposed through the opening and being configured to support a device under test through the opening;
   a probe holder disposed on the platform;
   at least one probe held by the probe holder, the probe holder being configured to control the probe to contact with the device under test;
   a plurality of first buffering pieces connected between the frame and the main body, the first buffering pieces being separated from each other; and
   a plurality of second buffering pieces connected between the platform and the main body, the second buffering pieces being separated from each other.

2. The probe station of claim 1, wherein the testing equipment is configured to transmit a high frequency signal to the device under test and receive a feedback signal from the device under test.

3. The probe station of claim 1, wherein at least one of the second buffering pieces is elastic.

4. The probe station of claim 1, wherein at least one of the second buffering pieces is a spring.

5. The probe station of claim 1, wherein at least one of the first buffering pieces is elastic.

6. The probe station of claim 1, wherein at least one of the first buffering pieces is a spring.

7. The probe station of claim 1, further comprising:
   a plurality of rollers connected to a side of the frame away from the platform.

8. The probe station of claim 1, further comprising:
   a microscope slidably connected with the platform and configured to obtain an image of the device under test.

9. The probe station of claim 8, further comprising:
   a display device connected with the frame and signally connected with the microscope.

10. The probe station of claim 8, wherein the opening is square in shape.

11. A probe station, comprising:
a trolley comprising:
a platform having an opening;
a plurality of rollers; and
a frame connected between the platform and the rollers, the frame having an accommodation space communicated with the opening;
a high-speed memory tester at least partially disposed in the accommodation space and at least partially exposed through the opening;
a probe holder disposed on the platform;
a probe held by the probe holder, the probe holder being configured to control a tip of the probe to contact with a memory card disposed on the high-speed memory tester through the opening and signally connected with the high-speed memory tester; and
a plurality of first buffering pieces connected between the platform and the high-speed memory tester, the first buffering pieces being separated from each other.

12. The probe station of claim 11, wherein the high-speed memory tester comprises:
a main body, the first buffering pieces are connected between the platform and the main body; and
a load board connected with the main body, the load board is exposed through the opening and is configured to support the memory card.

13. The probe station of claim 12, further comprising:
a plurality of second buffering pieces connected between the frame and the main body, the second buffering pieces being separated from each other.

14. The probe station of claim 13, wherein each of the first buffering pieces and each of the second buffering pieces are respectively elastic.

15. The probe station of claim 13, wherein each of the first buffering pieces and each of the second buffering pieces are respectively a spring.

16. The probe station of claim 11, further comprising:
a microscope slidably connected with the platform and configured to obtain an image of the memory card.

17. The probe station of claim 16, further comprising:
a display device connected with the frame and signally connected with the microscope.

* * * * *